US009044794B2

(12) United States Patent
Holsteyns et al.

(10) Patent No.: US 9,044,794 B2
(45) Date of Patent: Jun. 2, 2015

(54) ULTRASONIC CLEANING FLUID, METHOD AND APPARATUS

(75) Inventors: Frank Ludwig Holsteyns, Eksel (BE); Alexander Lippert, Villach (AT); Thomas Wirnsberger, Seeboden (AT)

(73) Assignee: LAM Research AG, Villach (AT)

( * ) Notice: Subject to any disclaimer, the term of this patent is extended or adjusted under 35 U.S.C. 154(b) by 1090 days.

(21) Appl. No.: 12/650,897

(22) Filed: Dec. 31, 2009

(65) Prior Publication Data
US 2011/0155169 A1    Jun. 30, 2011

(51) Int. Cl.
B08B 3/12        (2006.01)
H01L 21/67      (2006.01)
H01L 21/02      (2006.01)

(52) U.S. Cl.
CPC ............. *B08B 3/12* (2013.01); *H01L 21/02057* (2013.01); *H01L 21/67051* (2013.01)

(58) Field of Classification Search
None
See application file for complete search history.

(56) References Cited

U.S. PATENT DOCUMENTS

| | | | |
|---|---|---|---|
| 6,848,455 B1 * | 2/2005 | Shrinivasan et al. | 134/1.3 |
| 7,210,991 B1 | 5/2007 | Van Der Veen et al. | |
| 8,293,071 B2 | 10/2012 | Lee | |
| 2002/0026896 A1 | 3/2002 | Takekuma | |
| 2004/0069319 A1 | 4/2004 | Boyd et al. | |
| 2006/0137719 A1 | 6/2006 | Hasegawa et al. | |
| 2008/0017219 A1 * | 1/2008 | Franklin | 134/1 |
| 2008/0127888 A1 | 6/2008 | Kim et al. | |
| 2008/0276960 A1 | 11/2008 | Holsteyns et al. | |

FOREIGN PATENT DOCUMENTS

| | | |
|---|---|---|
| EP | 0989594 A2 | 3/2000 |
| EP | 0989594 A3 | 1/2005 |
| JP | 1174195 A | 3/1999 |
| JP | 2007311756 A | 11/2007 |
| JP | 2008-021672 A | 1/2008 |
| JP | 2008103701 A | 5/2008 |
| JP | 2008119642 A | 5/2008 |
| KR | 100873153 B1 | 12/2008 |
| WO | 2008008921 A2 | 1/2008 |

OTHER PUBLICATIONS

International Search Report, dated Sep. 22, 2011, in PCT/IB2010/055617.
Extended European Search Report, dated Dec. 17, 2013, from corresponding EP application.
Extended European Search Report, dated Jan. 3, 2014, from corresponding EP application.
Translation of Japanese Office Action, dated Oct. 21, 2014, from corresponding JP application.

* cited by examiner

*Primary Examiner* — Michael Kornakov
*Assistant Examiner* — Ryan Coleman
(74) *Attorney, Agent, or Firm* — Young & Thompson

(57) ABSTRACT

A cleaning fluid including dispersed gas avoids using ultrasonic energy to induce cavitation by subjecting a liquid containing dissolved gas to a pressure reduction in a bubble machine, to generate a gas/liquid dispersion. The cleaning fluid can be used to clean articles such as semiconductor wafers using a device that includes a holder and a vibrator for supplying ultrasonic or megasonic energy to the article.

8 Claims, 11 Drawing Sheets

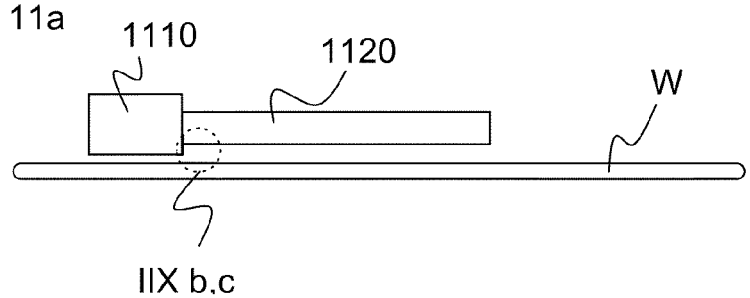
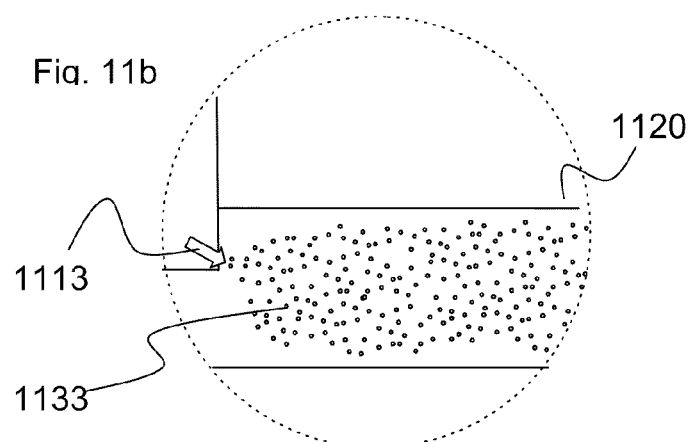
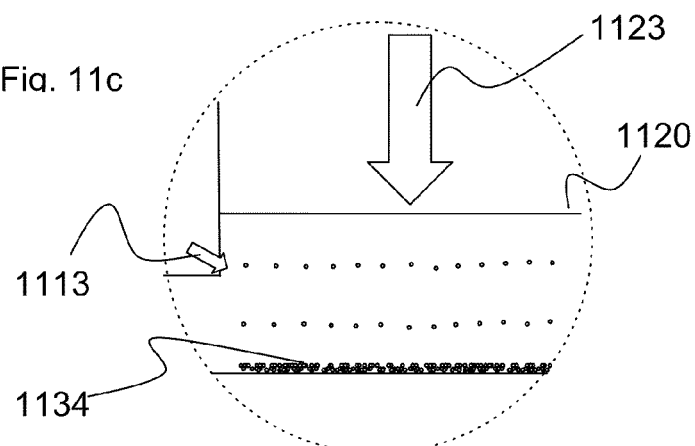

Fig. 14

| Transducer | BubbleMachine | Voltage | Cleaningnumber |
|---|---|---|---|
| 1a | no | 64 | -4 |
| | no | 124 | -5 |
| | yes | 32 | -4 |
| | yes | 64 | 1 |
| | yes | 124 | 14 |
| 1c | no | 64 | 0 |
| | no | 124 | 1 |
| | yes | 32 | -1 |
| | yes | 64 | 5 |
| | yes | 124 | 2 |
| 1d | no | 64 | -1 |
| | no | 124 | -3 |
| | yes | 32 | -3 |
| | yes | 64 | 0 |
| | yes | 124 | 6 |
| GR1 | no | 35 | 0 |
| | no | 70 | 12 |
| | yes | 20 | -3 |
| | yes | 35 | 3 |
| | yes | 70 | 19 |
| GR1b | no | 32 | 3 |
| | no | 63 | 14 |
| | no | 124 | 8 |
| | yes | 32 | 6 |
| | yes | 63 | 16 |
| | yes | 124 | 15 |
| towelcleaned | | | 14 |

ULTRASONIC CLEANING FLUID, METHOD AND APPARATUS

BACKGROUND OF THE INVENTION

1. Field of the Invention

The invention relates to the field of fluids containing gas bubbles used in ultrasonic cleaning of substrate surfaces.

2. Description of Related Art

Removal of particulate contaminants from a semiconductor substrate can be accomplished by ultrasonic cleaning. An ultrasonic cleaner, often colloquially referred to as a sonicator, is a cleaning device that uses ultrasound (usually from 150-1,500 kHz) and an appropriate cleaning solution to clean delicate items. When the frequency of ultrasound is close to or above 1,000 kHz (1 MHz) it is often referred to as "megahertz". Ultrasound is not effective without the cleaning solution, but it enhances the effect of a solution appropriate for the item to be cleaned and the soiling.

In an ultrasonic cleaner, the object to be cleaned is placed in a chamber containing a suitable solution (aqueous or organic compound, depending on the application). In aqueous cleaners, a surfactant may be added to break down the surface tension of the water base. An ultrasound generating transducer built into the chamber, or lowered into the fluid, produces ultrasonic waves in the fluid by changing size in concert with an electrical signal oscillating at ultrasonic frequency. This creates sufficiently energetic compression waves in the liquid of the tank which 'tear' the liquid apart, leaving behind many millions of microscopic 'voids' or 'partial vacuum bubbles' (cavitation). These bubbles collapse with enormous energy: temperatures of 10,000 K and pressures of 350 10^6 Pa have been reported. However, the bubbles are so small that they do no more than clean and remove surface dirt and contaminants. The higher the frequency, the smaller the nodes between the cavitation points, which allows for cleaning of more intricate detail.

In semiconductor wafer cleaning the nucleation of the acoustic cavitation often requires the proper pre-treatment of the liquid and elevated acoustic pressures to achieve the onset of nucleation. Furthermore, this nucleation results in limited nucleation densities from which only a small portion, related to the size distribution, will be active in cleaning. Typically the elevated acoustic pressure will drive bubble oscillations to a more violent regime (transient cavitation), which usually causes damage. The ultrasonic cleaning process is thus often tuned for nucleation and not for its microscopic effects (results of the bubble activity), which is required to avoid any structural damage on, e.g., fragile structures present on the substrate.

There is therefore a need for treatment and cleaning technologies that effectively process or clean with minimal damage to the substrate.

SUMMARY OF THE INVENTION

It is accordingly an object of the present invention to produce a method and device for treating articles that overcomes, at least in part, the disadvantages of the conventional art.

The invention, in part, pertains to a device for treating an article that includes a holder for holding the article, a vibrator for supplying ultrasonic or megasonic energy to the article, a generator for generating a treatment fluid, in which a gas is dissolved preferably at a pressure of at least about 1 bar above the pressure at which the article is treated, and a fluid supplier for supplying the treatment fluid to the article, where the treatment fluid is a gas containing fluid that generates a gas dispersion in the treatment fluid when the pressure is reduced.

The invention, in part, pertains also to a method of treating an article, which includes generating a treatment fluid, in which a gas is dissolved at a pressure of at least about 1 bar above the pressure at which the article is treated, such that the treatment fluid is a gas containing fluid that generates a gas dispersion in the treatment fluid when the pressure is reduced, supplying the treating fluid to the article, and supplying ultrasonic or megasonic energy to the article.

The invention, in part, still further pertains to a treatment fluid that is formed from a dispersion that includes more than about 99 vol.-% liquid and more than about 0.001 vol.-% gas, where the gas is dispersed in the fluid at a bubble size with a bubble size distribution where 90% of the bubbles are in a range of a bubble diameter d, wherein $d \leq 1.2*ds$ and $d \geq 0.8*ds$, wherein ds is a selected number in a range of about 0.5 µm to about 10 µm.

It is to be understood that both the foregoing general description and the following detailed description are exemplary and explanatory and are intended to provide further explanation of the invention as claimed, but are not intended to limit the scope of protection afforded by the appended claims.

BRIEF DESCRIPTION OF THE DRAWING FIGURES

The accompanying drawings are included to provide a further understanding of the invention. The drawings illustrate embodiments of the invention and together with the description serve more fully to explain the principles of the embodiments of the invention.

FIG. 11a shows the operation of the wet treatment apparatus with the proximity head.

FIG. 11b shows the operation at the injection orifice of the wet treatment apparatus with the proximity head.

FIG. 11c shows the operation at the injection orifice of the wet treatment apparatus with the proximity head when the sound is turned on.

Figure 12:
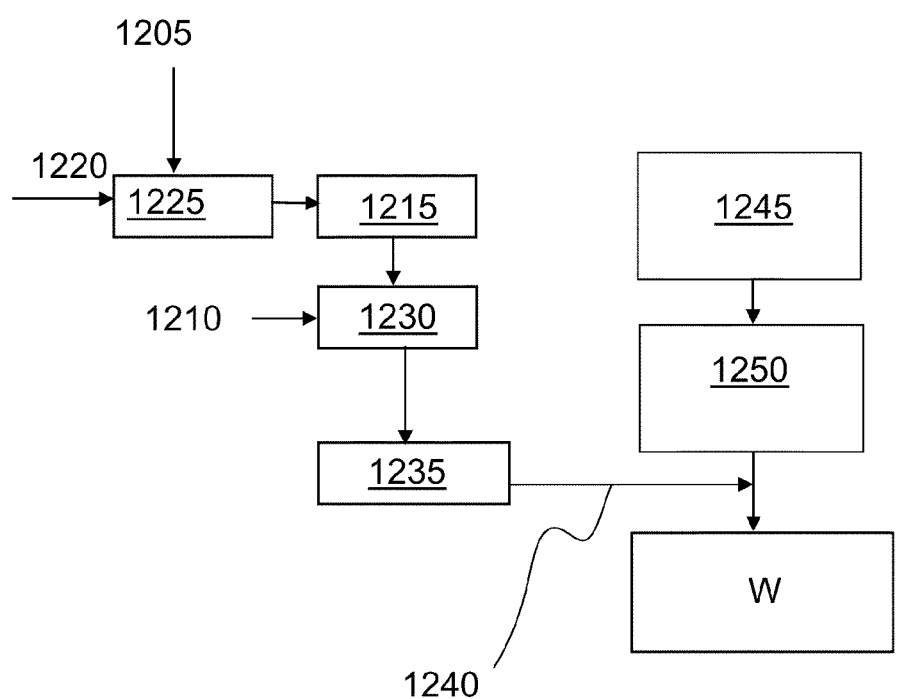

FIG. 12 a schematic diagram of the external medium supply unit.

Figure 13A:
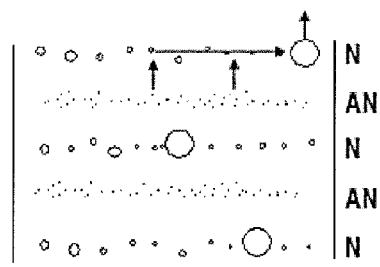

FIG. 13a shows a diagram of large and small bubbles congregating at the nodes and antinodes.

Figure 13B:
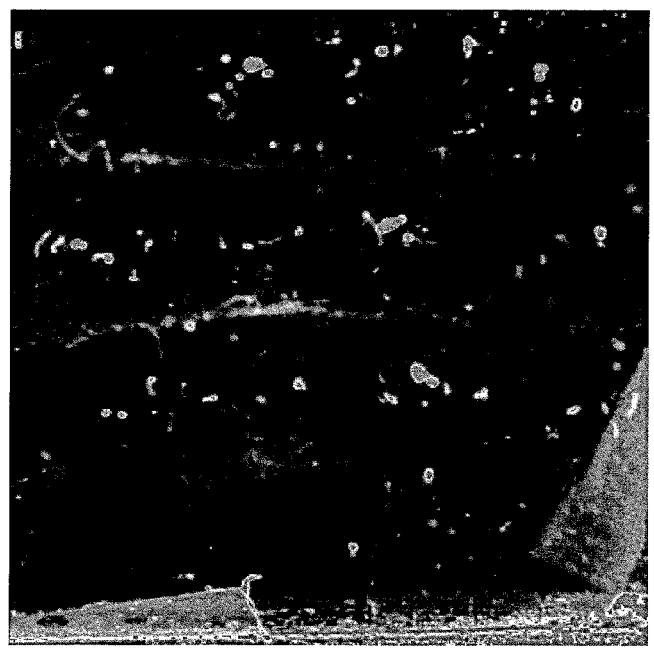

FIG. 13b shows a photograph of large and small bubbles congregating at the nodes and antinodes.

FIG. 14 shows the cleaning of glass slides contaminated with about 300 nm diameter particles.

Figure 15:
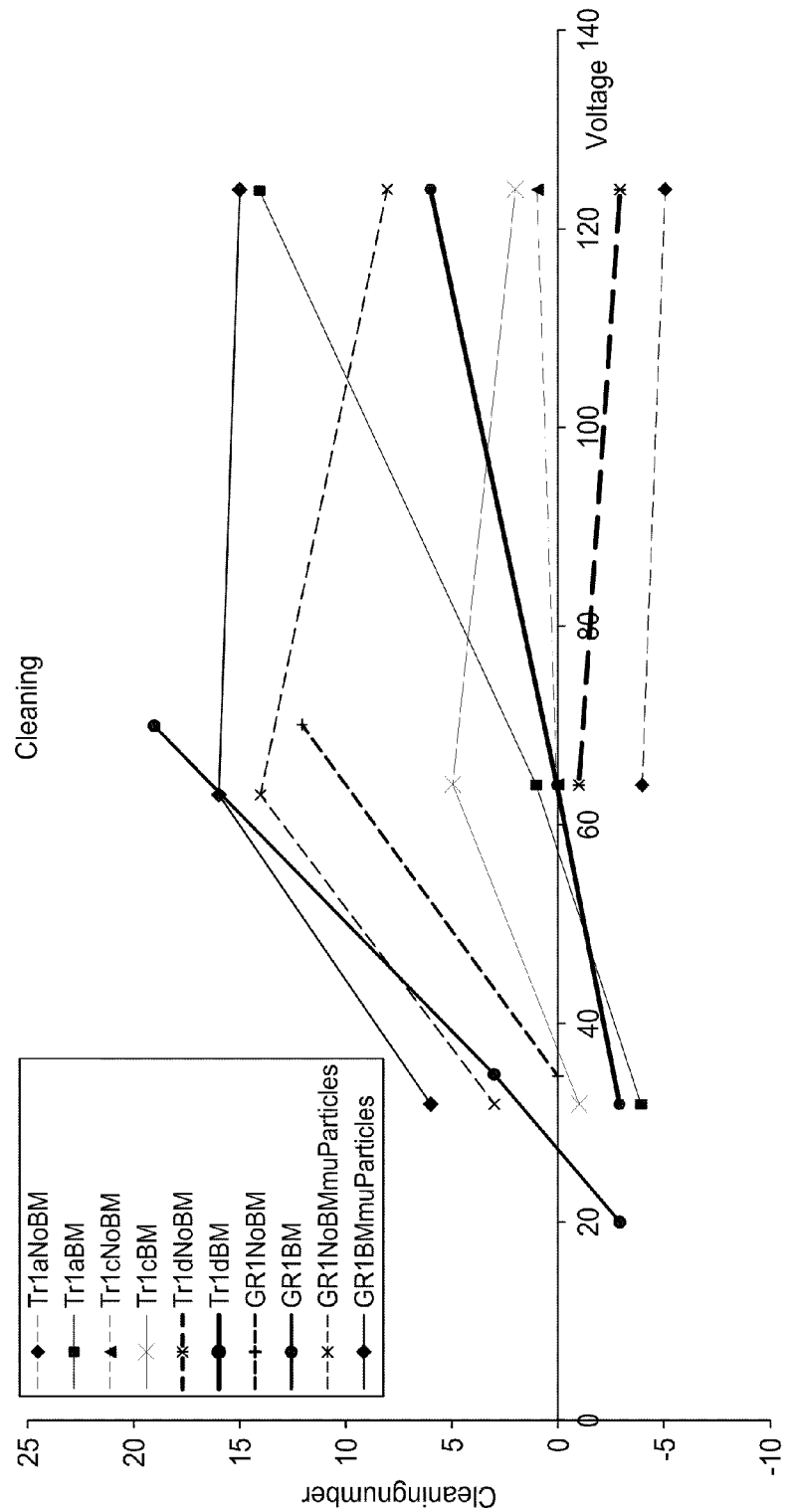

FIG. 15 shows a comparison of cleaning number for different transducers.

Figure 16:
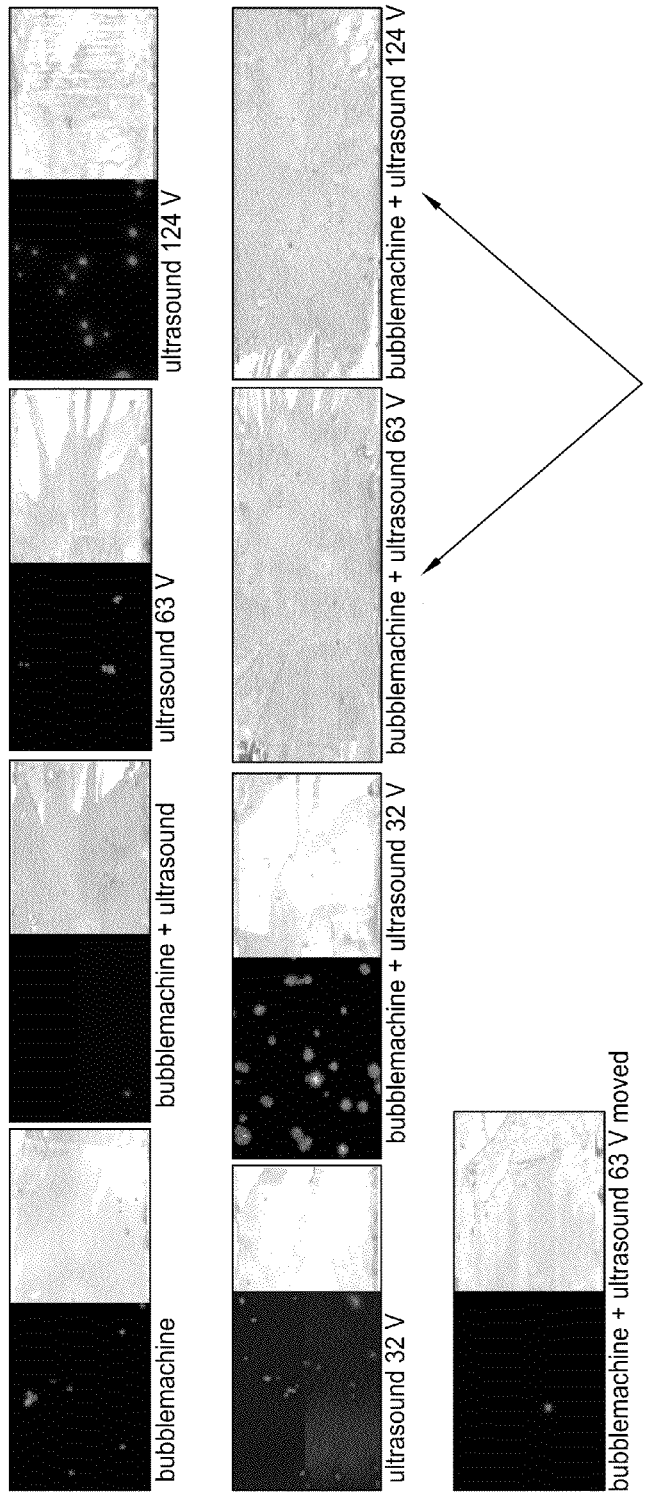

FIG. 16 shows cleaned slides and fluorescence pictures.

DETAILED DESCRIPTION OF PREFERRED EMBODIMENTS

The treatment or cleaning process is a physically enhanced chemical process whereby a substrate is submerged in or coated with an aqueous or a chemical fluid, which is exposed to ultrasonic waves, often referred to as "megasonic cleaning" when the frequency of the sound field is chosen in the MHz-frequency-range. The sound wave interacts with the fluid to generate a certain bubble distribution in space and time with a specific bubble size population, which in turn mediates the microscopic effects (in this exemplary case targeting the cleaning of the semiconductor substrate) via their oscillation and/or collapse properties.

An aspect of the process is to produce a fluid that is better adapted to cleaning. This enhanced fluid preferably has an elevated gas content and/or number of entrained gas bubbles. The gas content of the fluid according to the invention, or a substantial part of it, is generated not by the ultrasonic vibration as is conventional in this art, but rather is generated independently of the sonicator by subjecting a liquid with a controlled content of dissolved gas to a reduction in pressure so as to cause gas bubbles to come out of solution. The overpressure of the liquid containing dissolved gas can preferably be about 1 bar over ambient pressure. The result is a liquid with an elevated dissolved gas content up to saturation and can even be a supersaturated solution. Besides an elevated level of dissolved gas, gas bubbles can also be entrained in the liquid. Since the entrained gas bubbles are finely divided, the entrained gas can exist as a relatively stable dispersion.

As a result, when the cleaning fluid is sonicated, the sonication effect of migrating and collapsing sonication bubbles is attained with a lower expenditure of energy and with fewer destructive side effects. Moreover, as the gas bubbles are generated independently of the sonicator, the ultrasonic energy can be tuned to optimize the cleaning effect of the fluid on the substrate, rather than used to create bubbles in the fluid.

This effect is produced with aid of a "bubble machine" that bypasses or modulates the nucleation of the bubbles by high power sound fields. The bubble machine provides high amounts of bubbles directly into the active cleaning area.

The associated advantages include:

1) These bubbles can be easily positioned and activated by a weak sound field, which delivers the right energy to start the cleaning activity but can avoid any transient cavitation.

2) These bubbles can be inserted in a strong acoustic sound field to enhance the overall transient bubble population density and the creation of stable acoustic cavitation structures.

As a consequence, the utilization of a bubble machine as described herein allows the reduction of process time and a better tuning of the induced microscopic effects required to control the removal of particulate contamination versus damage.

The bubble machine injects high amounts of bubbles directly in the active sound field and therefore creates high bubble population densities and avoids any bubble nucleation threshold, which allows shorter process times and if required a lower operational acoustic power.

The impact of acoustic cavitation has been recognized and stimulated by increasing and optimizing the overall level of gasification of the process liquid, which could also be controlled by adjusting the temperature and pressure of this liquid.

The short life time of active bubbles, which continuously undergo a degasification process (towards larger bubble sizes), requires local and multiple injection points within an acoustic sound field, preferably directly onto the substrate under treatment. In the invention, only a part of the process liquid (for example, UPW—ultrapure water—or other solvents) can be gasified and by multiple orifices injected into any chemistry and local sound field, where bubbles will subsequently be generated by decompression.

The bubble machine generates a continuous supply of bubbles, which interact with the present soundscape in the medium to from a distinct bubble structure. One aspect of the characterization and comprehension of a bubble structure is the translational behaviour of individual bubbles within, for example, a standing ultrasonic wave field. As a result, three groups of bubbles, with a specific bubble trajectory, can be distinguished: "large" bubbles, which go to the node; "small" bubbles, which go to the antinode; and "intermediate" bubbles, which have equilibrium positions between the antinode and the node.

Moreover, there are translationally unstable bubbles, which were named "traveling" bubbles. These latter have no equilibrium space position and have to execute translational reciprocating oscillations between the antinode and the node. The thresholds for the different bubble trajectories and the microscopic effects induced by bubble instabilities will depend on the driving pressure amplitude of the sound field, the size of the bubble and the position of the bubble within the acoustic field. These thresholds can be typically shown in a phase diagram, which denotes the parametric regions of various surface instabilities, and a translation diagram, which denote the parametric regions of small, intermediate, traveling and large bubble for individual bubbles present in a standing wave field.

As a consequence, the introduction of a bubble machine allows the reduction of process time and a better tuning of the induced microscopic effects required to control the removal of particulate contamination versus damage.

Figure 1A:
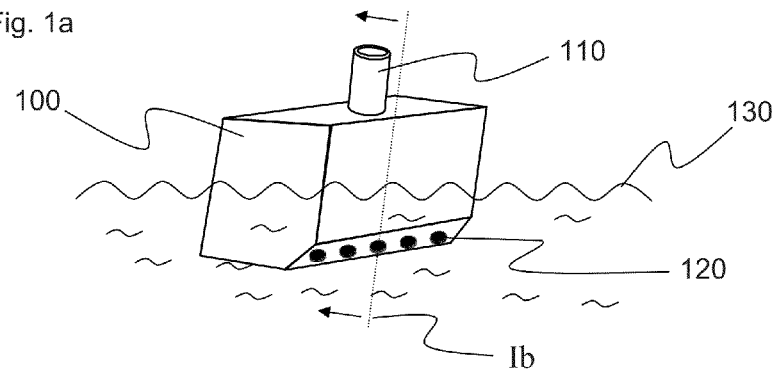
FIG. 1a shows a right front view of a bubble machine in accordance with an embodiment of the present invention.
Figure 1B:
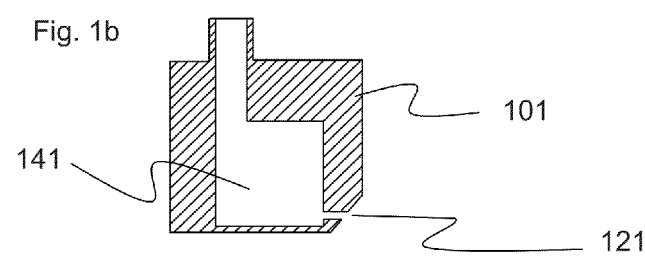
FIG. 1b shows a cross sectional view of the bubble machine of FIG. 1.

Referring now to the drawing figures, FIG. 1a and FIG. 1b show a first exemplary embodiment of the apparatus, in accordance with the present invention. In this right front perspective view, the main body housing 100 is shown, provided with one inlet opening 110. This inlet opening 110 has an inner diameter from about 1 mm to about 20 mm and is connected to an external medium supply unit, and provides a pressurized and a gasified medium to an inner chamber 141 of the bubble machine as shown in FIG. 1b. Injection orifices 120, 121 are positioned on an angled surface. Although 5 injection orifices are shown, there can be a wide range of injection orifices ranging from about 1 to about 30 per 100 $mm^2$, preferably about 16 per 100 $mm^2$. The injection orifices 120 have a diameter from about 50 µm to about 500 µm, but preferable between 200 and 350 µm and are designed to create a pressure drop in the medium between the inner chamber 141 and the surrounding medium 130, in which the bubble machine is immersed. This surrounding medium 130 can differ from the supplied medium. The pressure drop can be chosen in a range where the dissolved gas in the supplied medium starts to outgas. As a consequence of the outgassing, many small gas bubbles will be created and injected in the surrounding medium 130.

The immersion depth of the main body housing 100, 101 should be chosen such that the injection orifices 120 are submerged in the surrounding medium 130 and therefore set between about 0.5 mm and about 350 mm for immersion in a tank or between about 0.3 mm and about 10 mm for immersion between two parallel plates. Alternatively, the main body housing 100, 101 can be entirely submerged in the surrounding medium 130.

Figure 2:
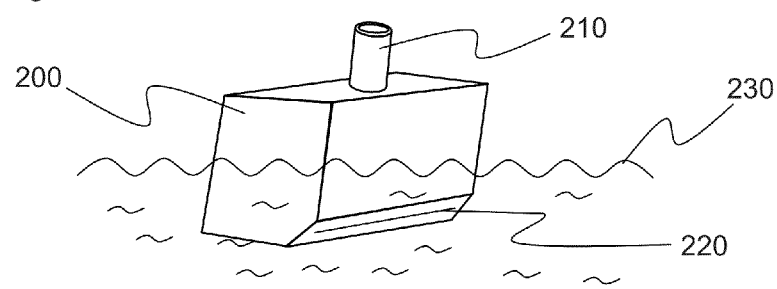
FIG. 2 shows an alternative design of the body of the bubble machine.

FIG. 2 shows an alternative design of the body of the bubble machine. The body housing 200, which is connected to an inlet opening 210, is this time fitted with an injection slit 220. The injection slit 220 can cover up to the entire length of the angled surface and has a width from about 50 µm to about 500 µm, but preferably between about 200 and about 350 µm (see FIG. 6c). The injection slit 220 is designed to create a pressure drop in the medium between the inner chamber and the surrounding medium 230, in which the bubble machine is partially or entirely submerged.

Figure 3:
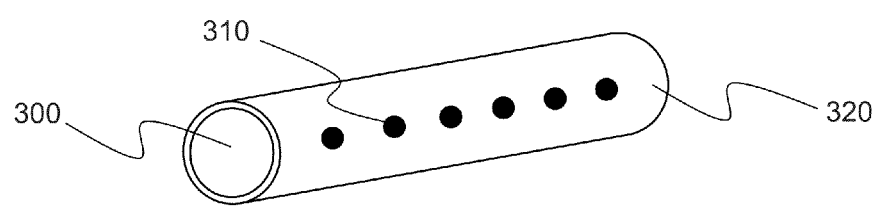
FIG. 3 shows another alternative cylindrical design of the body of the bubble machine.

FIG. 3 shows an alternative design of the body of the bubble machine. In the main body housing 320 is one inlet opening 300, which is connected to the external medium supply, and multiple injection orifices 310, which are positioned in a row along the round shaped body. This bubble machine can be partially or entirely submerged in the surrounding liquid.

Figure 4:
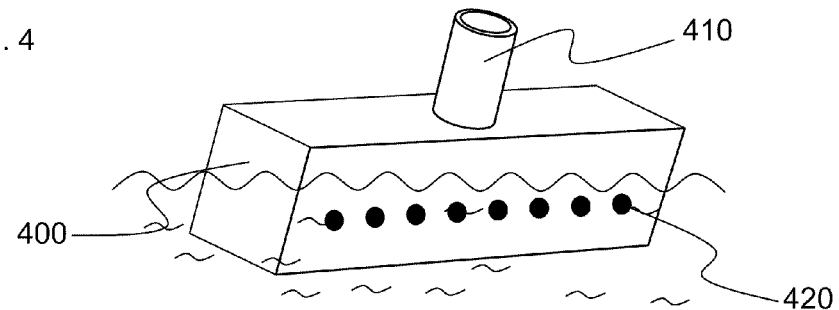
FIG. 4 shows a bubble machine with multiple injection orifices.

FIG. 4 shows an alternative design of the body of the bubble machine. In the main body housing 400 is one inlet opening 410, which is connected to the external medium supply, a plurality of injection orifices 420, which are positioned in a row along a rectangular shaped body. This bubble machine can be partially or entirely submerged in the surrounding liquid.

For some applications, the medium flow provided by the injection orifices or the injection slit is not sufficient to fill the air gap between two parallel plates having a distance from about 0.1 to about 20.0 mm with a medium or maintain a required level of the surrounding medium. Therefore, an arrangement with additional outlets should be provided to the bubble machine. Further exemplary embodiments are shown in FIGS. 5-6.

Figure 5A:
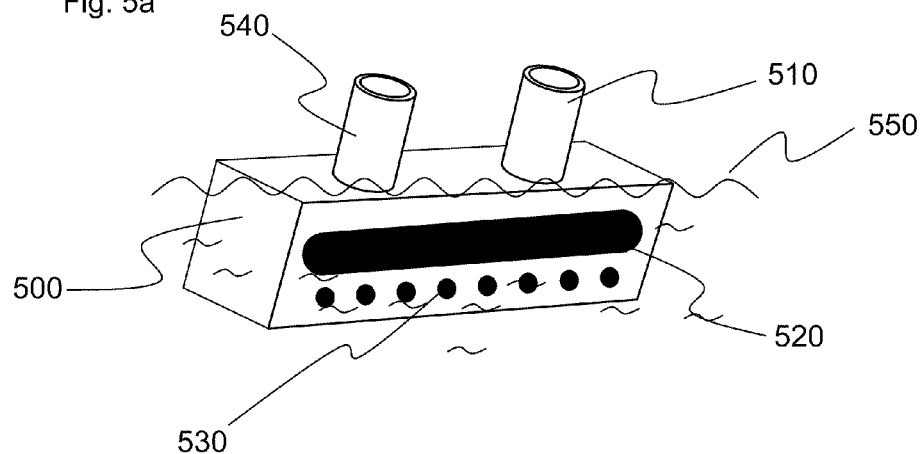
FIG. 5a shows a bubble machine with a slit and orifices.
Figure 5B:
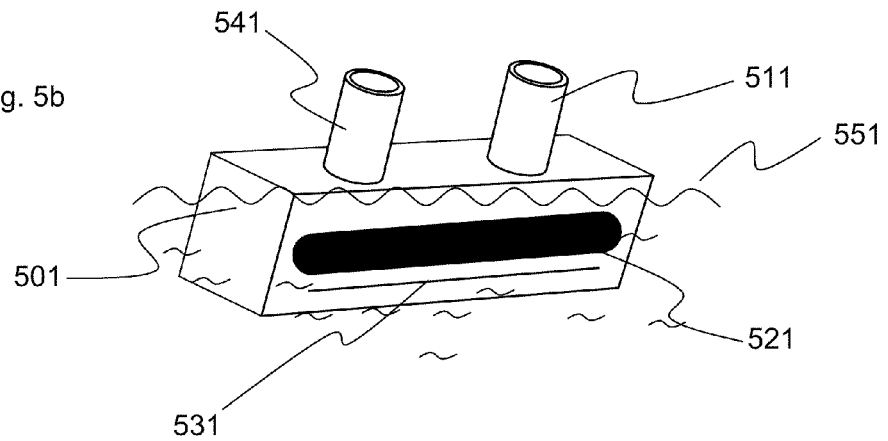
FIG. 5b shows a bubble machine with an injection slit and an outlet slit.

In FIG. 5a and FIG. 5b an additional outlet is added to the main body housing 500, 501 in the form of an outlet slit 520, 521, which supplies the surrounding medium 550, 551 so bubbles can be injected efficiently into the surrounding medium 550, 551. The surrounding medium inlet opening 540, 541 is different and separated from the inlet opening 510, 511 and can be added to one of the side walls of the main body housing 500, 501 as, for example, on top of the main body housing as shown in FIG. 5a and FIG. 5b. The outlet slit 520, 521 can be positioned above the injection orifices 530 or the injection slit 531.

Figure 6A:
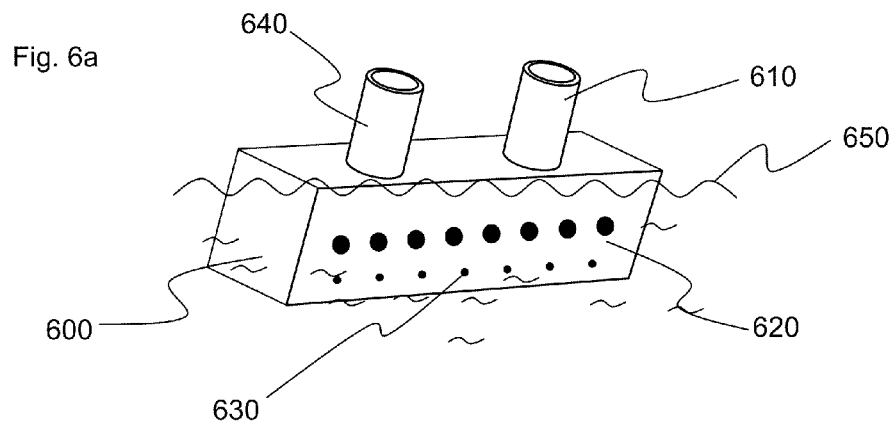
FIG. 6a shows a bubble machine with different orifice sizes.
Figure 6B:
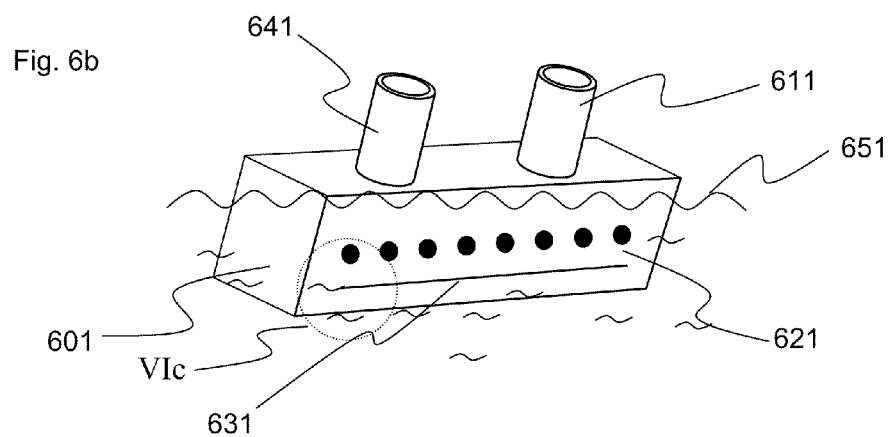
FIG. 6b shows a bubble machine with in injection slit and output orifices.

FIG. 6a and FIG. 6b show alternative designs of the bubble machine. Additional outlet orifices 620, 621 supply in this arrangement the surrounding medium 650, 651 so bubbles can be injected efficiently in the surrounding medium 650, 651. The outlet orifices 620, 621 are a series of larger holes, which have a diameter from about 50 µm to about 2000 µm. The surrounding medium inlet opening 640, 641 is different and separated from the inlet opening 610, 611 and can be added to one of the side walls of the main body housing 600, 601 as for instance on top of the main body housing as shown in FIG. 6a and FIG. 6b. The outlet orifices 620, 621 can be positioned above the injection orifices 630 or the injection slit 631.

Figure 6C:
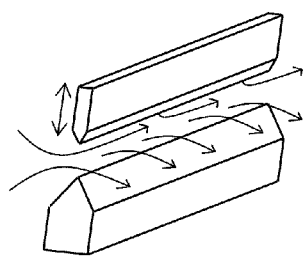
FIG. 6c is a detailed view of an injection slit.

FIG. 6c shows a detailed picture of the injection slit. The slit has an upper part and a lower part. In order to vary the small gap between the two parts, at least one of them can be movable.

Figure 7:
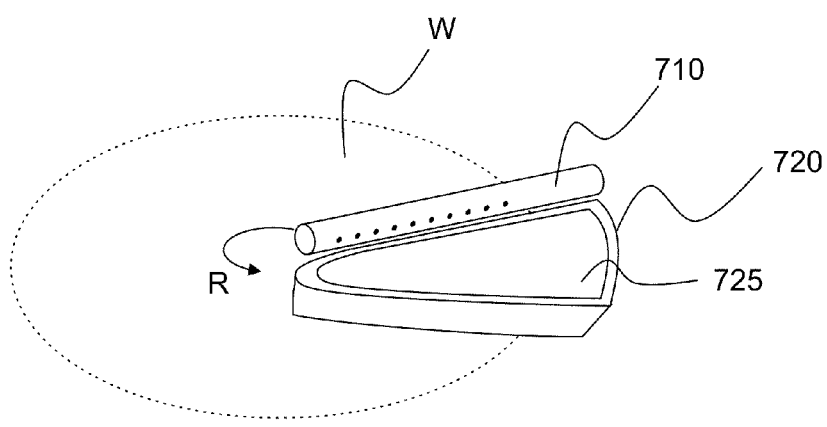
FIG. 7 shows a wet treatment apparatus.
Figure 8:
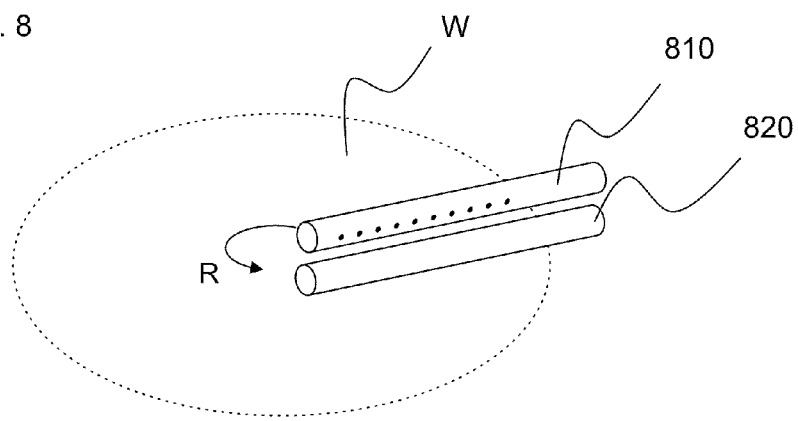
FIG. 8 shows an alternative wet treatment apparatus.
Figure 9:
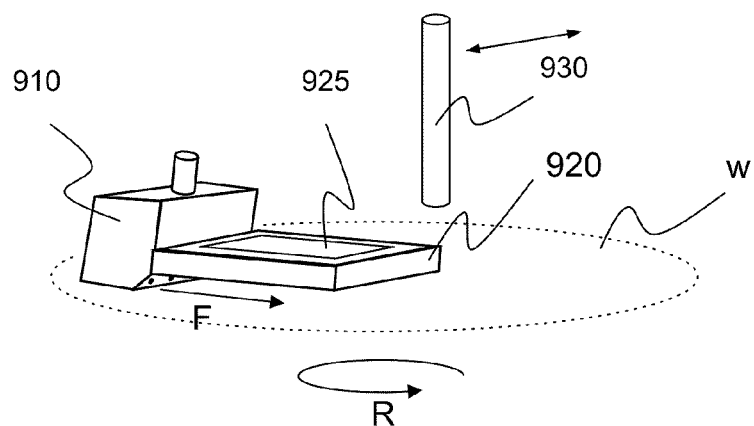
FIG. 9 shows another alternative wet treatment apparatus.

FIGS. 7-9 show a variety of wet treatment apparatuses in the field of ultrasonic cleaning according to the present invention. On top of a rotating R work piece W a bubble machine 710, 810, 910 is mounted in a way that the injection orifices are dispensing a bubbly liquid in between or in the proximity of a transducer plate 720, 920 or a transducer rod 820 and the work piece. Both the transducer plates 720, 920 and the transducer rod 820 generate an acoustic sound field within the liquid immersed on the work piece W and in contact with the transducer 720, 820, 920.

The outlet of the bubble machine should be adjacent the source of ultrasonic energy, which is to say that the outlet of the bubble machine can be in contact with the sonicator or in close proximity thereto, e.g., a distance of the discharge to the source of ultrasonic energy is preferably not more than 50 mm.

A work piece in this application is a wafer or a mask, which are both used in semiconductor chip manufacturing. The wafer is shaped like a plate or disc. However, the invention is not restricted to semiconductor type objects.

The gap between the surface of the work piece and the transducer surface varies between 0.5 mm and 10 mm. The transducer consists of a main body, which could be made of quartz, sapphire or TEFLON (polytetrafluoroethylene) coated aluminum, and a piezoelectric part 725, 925. The piezoelectric part 725, 925 is called a transformer. This transformer can be glued at the bottom side of plate. Additional surrounding medium can be supplied to the work piece by a translating nozzle 930.

Figure 10:
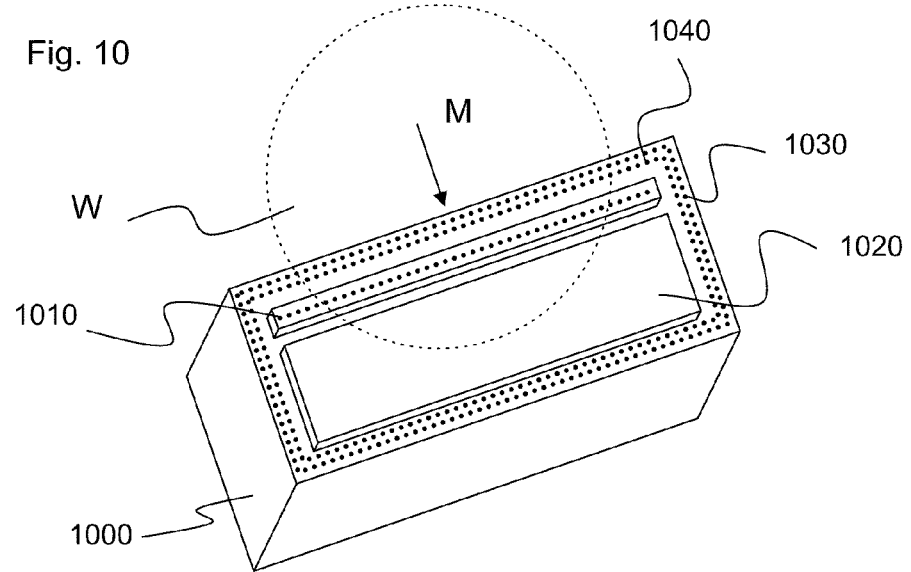
FIG. 10 shows a wet treatment apparatus with a proximity head.

FIG. 10 shows an embodiment of a wet treatment apparatus according to the present invention. At one side of a translating M work piece W the main body housing 1000 is placed. A bubble machine 1010 is mounted next to a transducer plate 1020. This embodiment is based on the proximity head as described in US2004/0069319A1. Liquid is introduced through the inner array 1040 of liquid nozzles and is drawn from the proximity head through the outer array 1030 of vacuum nozzles which are connected to a vacuum source (not shown).

FIGS. 11a-c describe the operation of a bubble machine 1110 in combination with an acoustic sound field, generated by a transducer 1120, to clean a work piece W. As shown in detail in FIG. 11b, an injection orifice 1113 is designed to create a pressure drop in the medium between the inner chamber and the surrounding medium, in which the bubble machine is immersed. The pressure drop can be chosen in a range where the dissolved gas in the supplied medium starts to outgas. As a consequence of the outgassing, many small gas bubbles 1133 will be created and injected in the liquid between transducer and work piece W.

FIG. 11c shows that when the sound field 1123 is turned on, a specific soundscape is generated in the liquid between the transducer 1120 and the work piece W. This leads to a certain bubble distributions 1134 in space and time with specific bubble size populations, within the bulk liquid and on the surface of the work piece W. The microscopic effects of these acoustically activated bubbles, mediated via their oscillation and/or collapse properties, leads to the cleaning of the surface of the work piece W.

FIG. 12 shows a schematic diagram of the external medium supply unit. The liquid 1220 is in a first step degassed by a membrane contactor 1225 under vacuum 1205, in a following step, a heater 1215 allows a temperature control of the liquid in the range of about 20-90° C. The heating unit is followed by a gasification unit 1230 and allows dissolving gas 1210 into the water. The amount of gas dissolved depends on the membrane used, the partial pressure of the gas, the pressure of the water, the water flow and the water temperature. These parameters can be controlled and so the level of gasification. Subsequently, the bubble machine 1235 generates by decompression a bubble liquid at multiple points within a sound field, which allows the treatment of the surface of a workpiece as discussed in FIG. 11c.

Some of the parameters pertaining to the optimized performance of the cleaning fluid and the bubble machine include:
Pressure
Position of reduction valves
size and number of holes
pressure and flow of liquid before mixing
pressure and flow of gas before mixing
pressure and flow of mixture after mixing
way of applying ultrasonic
Temperature Regarding pressure, the inlet pressure for the bubble machine is from about 1 to about 10 bar, preferably about 3.5 bar.

The holes or orifices have a diameter of about 50 µm to about 350 µm, preferably between about 200 µm to about 350 µm. The holes or orifices are generally round in shape but are not restricted to this shape. Other shapes such as ovals, squares, triangles, parallelopipeds, polygons, etc. can be used.

In the one dimensional case (all the holes in a row next to each other), there are preferably about 4 about 200 µm to about 350 µm diameter holes per 10 mm length. However, there can be other numbers of holes from at least 1 to 20.

In the two dimensional case all the holes can be arranged within a rectangular field, with at least one about 200 µm to about 350 µm diameter hole being within each field of 100 mm$^2$. Preferably there are 16 holes per 100 mm$^2$. However, there can be other numbers of holes from at least 1 to 30.

The temperature of the liquid is preferably between about 20 to about 90° C. The liquid can be water or an aqueous system. A surfactant, (nonionic, cationic or anionic) can be added to the water. The liquid can be aggressive aqueous based etchant systems based upon HF or can be RCA clean. Also, reactive systems can be used, that is, aqueous or non-aqueous systems that are charged with oxidative acids (for example $HNO_3$, ozone, hydrogen peroxide, periodic acid, ceric acid, etc.)

Non aqueous solvents can include $C_1$-$C_{10}$ straight and branched alcohols, acetone, toluene, ethylene glycol, diethylene glycol, propylene glycol, EGMEA (ethylene glycol monoethylether acetate), PGMEA (propylene glycol monoethylether acetate), etc.

Regarding the pressure and flow of liquid before mixing, the inlet pressure is from about 1 to about 10 bar, preferably about 3.5 bar. The flow can be from about 10 ml/min per about 300 µm hole to about 200 ml/min per 300 µm hole. That is for about 5 holes at about 300 µm and at about 3.5 bar, the flow is about 370 ml/min. In one preferred embodiment, gas is introduced to the liquid at a pressure of at least about 2 bar through a nozzle size of about n≤0.2 mm$^2$.

Regarding the pressure and flow of gas before mixing, inlet pressure of gas ($N_2$ or $O_2$) from about 0 to about 10 bar. Preferably, the pressure and flow may be between about 0.02 and about 0.7 bar @ 370 ml/min (depending on the type of gas exchange unit and the amount of unit installed in the system). After mixing, because it is still a pure liquid (one phase), the pressure and flow may be the same as before mixing.

The gas flow can preferably be from about 0.1 slpm to about 10 slpm (standard liter per minute).

Although the preferred gases are $N_2$ or $O_2$, other gases can be used such as air, Ar, Xe, Ne, $CO_2$, NO, $NO_2$, etc.

One interesting case is that of carbonic acid ($CO_2$). Water absorbs a greater amount of carbonic acid with increased pressure. The amount of carbonic acid in water increases in proportion to the pressure. At the pressure of about 1 bar the water will absorb its own volume; at the pressure of about 2 bar, twice its own volume; at about 3 bar, three times its own volume, and soon, until at about 37.2 bar, the carbonic acid gas itself becomes a liquid.

Of course, the solubility of gases in liquids under moderate conditions is governed by Henry's law, where $H=p_d/x_a$=bar/mole fraction of solute in solution. For many gases Henry's law holds quite well when the partial pressure of the solute gas is less than about 1 bar. H is seldom independent of the partial pressure of the solute gas. In these instances H varies with the partial pressure and a given value of H can be used over only a narrow range of pressures. See *Perry's Handbook of Chemical Engineering* 5$^{th}$ Ed., page 14-3 (1973). For example air has $10^{-4} \times H$ of about 6.64 at 20° C., and $N_2$ has $10^{-4} \times H$ of about 8.04 at 20° C.

However, in the present invention Henry's law appears to break down at the elevated pressure of at least about 1 bar over ambient and the amount of gas present in the liquid goes to saturation and even to a state of supersaturation so that the resulting liquid can be considered to be in equilibrium with a dispersion or to have an entrained dispersion of bubbles. The result is that no ultrasonic energy is required to induce cavitation, especially when the bubble machine is utilized, and the action of the bubbles produced by the bubble machine and directed by relatively weak ultrasonic energy unexpectedly reduces damage compared to that caused by the high energy application of conventional ultrasound.

Ultra/megasonic energy is applied, where the sonic energy is coupled into the water by a transducer system (piezoelectric element glued on a matched carrier of quartz, sapphire or coated aluminum). The electrical parameters can be frequency from about 10 khz to about 3 Mhz, and power from about 0.01 Watts/cm$^2$ to about 100 Watts/cm$^2$.

In a preferred embodiment, the treatment fluid is an aqueous dispersion that includes more than about 99 vol.-% to about 99.999 vol.-% liquid and more than about 0.001 vol.-% to about 1 vol. 1% gas, where the gas is dispersed in the fluid at a bubble size with a bubble size distribution of 90% of the bubbles being in a range of a bubble diameter d, wherein d≤1.2*ds and d≥0.8*ds, wherein ds is a selected number in the range of about 0.5 µm to about 10 µm (preferably about <5 µm).

The bubble diameter ds is a function of wave-length λ. For example 1 mHz leads to λ=1.48 mm, which leads to ds=λ/500, which is about 3 µm.

Experimental results verify the advantages of the invention.

In the application of ultrasound to a treatment fluid produced using the bubble machine, large bubbles congregate at the nodes while small bubbles congregate at the antinodes, as is diagrammed in FIG. 13a. Photographic verification of this bubble size segregation is shown in FIG. 13b, in which a 38 kHz transducer is used.

The cleaning of contaminated glass slides was compared with ultrasound both with and without the bubble machine was compared. A particle mixture was applied to each slide with a pipette, and the excess was spun off. The cleaning of glass slides contaminated with about 300 nm diameter particles is shown in FIG. 14, where different transducer geometries were used. The result was that the utilization of the bubble machine to generate the gas/liquid dispersion increased the cleaning number relative to when sonication alone was used. A comparison of the cleaning with and without the bubble machine for different transducer geometries is shown in FIG. 15. Dashed lines indicate when no bubble machine was used, and solid lines indicate when the bubble machine was used. Here, the advantageous increase of cleaning number with the bubble machine is clear.

Flourescence imaging of the slides is shown in FIG. 16. The dark slides are the cleaned slides. In some instances, no particles at all were found when both the bubble machine and sonification was used.

It is to be understood that the foregoing description and specific embodiments shown herein are merely illustrative of the best mode of the invention and the principles thereof, and that modifications and additions may be easily made by those skilled in the art without departing for the spirit and scope of the invention, which is therefore understood to be limited only by the scope of the appended claims.

What is claimed is:

1. A device for treating a surface of an article with a fluid, comprising:
    a holder configured to position an article in a predetermined orientation;
    a source of ultrasonic or megasonic energy positioned so as to vibrate a fluid medium adjacent the article at a selected wave-length; and
    a generator of treatment fluid configured to receive a liquid at a first pressure having dissolved gas therein and to discharge adjacent said source of ultrasonic or megasonic energy a treatment fluid at a second pressure lower than said first pressure, such that gas previously dissolved in said liquid comes out of solution in the form of bubbles;
    wherein said generator of treatment fluid is separate from said source of ultrasonic or megasonic energy and comprises a plurality of injection orifices positioned a predetermined distance from said source of ultrasonic or megasonic energy, wherein the injection orifices have a diameter from about 50 μm to about 500 μm.

2. The device according to claim 1, wherein the generator of treatment fluid comprises:
    a main body housing provided with an inlet opening;
    an external liquid medium supply unit connected to the inlet opening.

3. The device according to claim 2, wherein the inlet opening has an inner diameter from about 1 mm to about 20 mm.

4. The device according to claim 2, wherein the inject orifices are positioned on an angled surface of the main body so as to direct treatment fluid at an oblique angle relative to said holder.

5. The device according to claim 1, wherein the holder comprises gripping elements for engaging an edge of the article.

6. The device according to claim 1, wherein the source of ultrasonic or megasonic energy comprises a resonator positioned adjacent to the space to be occupied by the article so that a gap is formed with a width w of about 0.2 mm to about 3 mm.

7. The device according to claim 1, further comprising a supply of said liquid at a first pressure, and wherein said first liquid and said generator of treatment fluid are selected and configured such that the treatment fluid is a dispersion that comprises more than about 99 vol.-% liquid and more than about 0.001 vol.-% gas, wherein the gas is dispersed in the fluid at a bubble size with a bubble size distribution where 90% of the bubbles are in a range of a bubble diameter d, wherein d≤1.2*ds and d≥0.8*ds, wherein ds is a selected number in a range of about 0.5 μm to about 50 μm.

8. The device according to claim 1, wherein said device is a single wafer wet processing station for treating semiconductor wafers.

* * * * *